United States Patent
Hester

(10) Patent No.: US 6,803,811 B2
(45) Date of Patent: Oct. 12, 2004

(54) ACTIVE HYBRID CIRCUIT

(75) Inventor: Richard K. Hester, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/280,398

(22) Filed: Oct. 26, 2002

(65) Prior Publication Data

US 2004/0041624 A1 Mar. 4, 2004

Related U.S. Application Data

(60) Provisional application No. 60/406,748, filed on Aug. 30, 2002.

(51) Int. Cl.[7] ................................................. H03B 1/00
(52) U.S. Cl. ....................................... 327/552; 327/334
(58) Field of Search .................................. 327/552, 553, 327/554, 555, 556, 557, 558, 559, 334

(56) References Cited

U.S. PATENT DOCUMENTS

| | | | | |
|---|---|---|---|---|
| 5,982,228 A | * | 11/1999 | Khorramabadi et al. | 327/553 |
| 6,060,935 A | * | 5/2000 | Shulman | 327/553 |
| 6,452,444 B1 | * | 9/2002 | Mehr | 327/554 |
| 6,583,662 B1 | * | 6/2003 | Lim | 327/553 |
| 2002/0149508 A1 | * | 10/2002 | Hamashita | 341/172 |
| 2003/0067359 A1 | * | 4/2003 | Darabi et al. | 331/46 |
| 2003/0109239 A1 | * | 6/2003 | Sabouri et al. | 455/307 |
| 2003/0142816 A1 | * | 7/2003 | Koban | 379/399.01 |
| 2003/0169101 A1 | * | 9/2003 | Yamamoto et al. | 327/553 |

* cited by examiner

Primary Examiner—Terry D. Cunningham
(74) Attorney, Agent, or Firm—Wade James Brady, III; Frederick J. Telecky, Jr.

(57) ABSTRACT

A hybrid circuit has a transfer function having three zeros and four poles that are realized using only two fully-differential amplifiers in combination with a small plurality of resistors and capacitors, making the hybrid suitable for use with a communication medium comprising capacitively coupled non-ideal transformers and transmission lines while providing remarkably good hybrid rejection without the use of inductors.

10 Claims, 1 Drawing Sheet

ACTIVE HYBRID CIRCUIT

CLAIM TO PRIORITY OF PROVISIONAL APPLICATION

This application claims priority under 35 U.S.C. §119(e)(1) of provisional application serial number 60/406,748, filed Aug. 30, 2002, by Richard K. Hester.

BACKGROUND OF THE INVENTION

1. Field of the Invention

This invention relates generally to active hybrid circuits, and more particularly to an active R-C integrated circuit that enhances modem performance without compromising its hybrid rejection while avoiding the use of inductors.

2. Description of the Prior Art

Signals to and from a modem coexist simultaneously; and both the transmitted and received signals are superposed at nearly all circuit nodes in a full-duplexed communication system. Circuit techniques must then be employed to eliminate the transmitted signal from the receiver signal path to avoid corrupting the signal-to-noise ratio associated with the received signal. When the signals occupy different portions of the frequency spectrum, this can be achieved by using filters. If however, their spectra overlap, a circuit commonly referred to as a hybrid must be employed.

FIG. 1 illustrates a general hybrid 102 used in a communication system 100. Nodes A 104 and B 106 comprise different, generally frequency-dependent linear combinations of signals $V_T$ and $V_R$. If the communication medium 108 can be modeled as a resistive element, $R_M$, then $$V_B = \frac{V_R(R_S) + V_T(R_M + R_L)}{R_S + R_M + R_L} \quad (1)$$

The transmitted signal may be eliminated in the receiver path 110 if $$V_H = \frac{-V_A(R_M + R_L)}{R_S + R_M + R_L} \quad (2)$$

such that the receiver path signal becomes $V_B + V_H$. Thus, the hybrid 102 acts as an inverting voltage divider in this case, and as a frequency-dependent transfer function (filter) in general. The scheme 100 works whenever the linear combinations of $V_T$ and $V_R$ at nodes A 104 and B 106 are different.

Hybrid rejection is a measure of the degree to which the $V_T$ component is eliminated from the receiver path 110. Complete elimination is rarely ever achieved largely because it would require unacceptably complex hybrid circuits to replicate the voltage division that takes place when the communication medium 108 consists of transmission lines and transformers.

Hybrids to date have employed passive circuits. When transformers are part of the transmission medium 108, and particularly when the transformer winding inductance is small, good hybrid rejection at low frequencies requires that one or more inductors be used in the hybrid circuit 102. This is problematic since the required inductors undesirably increase the hybrid parts count as well as the area of the modem printed circuit board that employs the hybrid 102.

It is therefore both advantageous and desirable in view of the foregoing, to provide a hybrid circuit that is suitable for use with a modem associated with a communication medium comprising transformers, but that does not compromise its hybrid rejection while avoiding the use of inductors.

SUMMARY OF THE INVENTION

The present invention is directed to a hybrid circuit that is suitable for use with a modem associated with a communication medium comprising transformers, but that does not compromise its hybrid rejection while avoiding the use of inductors. The hybrid transfer function has three zeros and four poles that are realized using only two fully-differential amplifiers in combination with a small plurality of resistors and capacitors, making the hybrid suitable for use with a communication medium comprising capacitively coupled non-ideal transformers and transmission lines while providing remarkably good hybrid rejection without the use of inductors.

According to one embodiment, an active R-C circuit comprises a fully-differential amplifier; a pair of single-ended buffers; and a resistor-capacitor network connecting the fully-differential amplifier and the pair of single-ended buffers, wherein the filly-differential amplifier, pair of single-ended buffers and resistor-capacitor network are configured as a hybrid devoid of inductors to realize a transfer function associated with substantial elimination of a receiver path signal associated with a communication medium comprising capacitively coupled non-ideal transformers and transmission lines.

According to another embodiment, an active R-C circuit comprises a pair of fully-differential amplifiers; and a resistor-capacitor network connecting the pair of fully-differential amplifiers to realize a transfer function associated with substantial elimination of a receiver path signal associated with a communication medium comprising capacitively coupled non-ideal transformers and transmission lines, wherein the pair of fully-differential amplifiers and the resistor-capacitor network are configured as a hybrid devoid of inductors.

According to yet another embodiment, a method of providing a desired hybrid rejection comprises the steps of providing an active R-C circuit comprising a fully-differential amplifier, a pair of single-ended buffers; and a resistor-capacitor network connecting the fully-differential amplifier and the pair of single-ended buffers such that the fully-differential amplifier, pair of single-ended buffers and the resistor-capacitor network realize a hybrid transfer function consisting of three zeros and four poles; connecting the active R-C circuit into a communication system that employs a communication medium comprising transformers; and processing a transmitted signal passing through the active R-C circuit such that the processed signal is combined with a second signal associated with the communication system to substantially prevent the transmitted signal from passing through a communication system receiver path to provide substantially an equal level of hybrid rejection as that provided by a hybrid circuit that employs inductors to achieve a desired hybrid rejection associated with a communication medium comprising capacitively coupled non-ideal transformers and transmission lines.

According to still another embodiment, a method of providing a desired hybrid rejection comprises the steps of providing an active R-C circuit comprising a pair of fully-differential amplifiers and a resistor-capacitor network connecting the pair of fully-differential amplifiers to realize a hybrid transfer function consisting of three zeros and four poles; connecting the active R-C circuit into a communication system that employs a communication medium comprising transformers; processing a transmitted signal passing through the active R-C circuit such that the processed signal is combined with a second signal associated with the communication system to substantially prevent the transmitted signal from passing through a communication system receiver path to provide substantially an equal level of hybrid rejection as that provided by a hybrid circuit that employs inductors to achieve a desired hybrid rejection associated with a communication medium comprising capacitively coupled non-ideal transformers and transmission lines.

The particular embodiments of the active R-C circuit comprise a transfer function that can optionally be made programmable via a data processing device such as a digital signal processor, a central processing unit, a computer, a micro-computer, and a micro-controller, among others.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawing figures wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
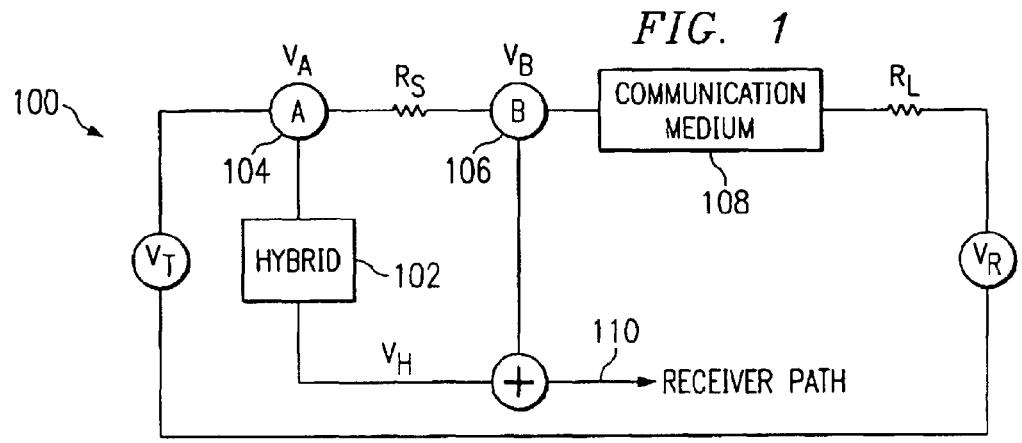
FIG. 1 is a diagram illustrating a general hybrid arrangement that is known in the art.
Figure 2:
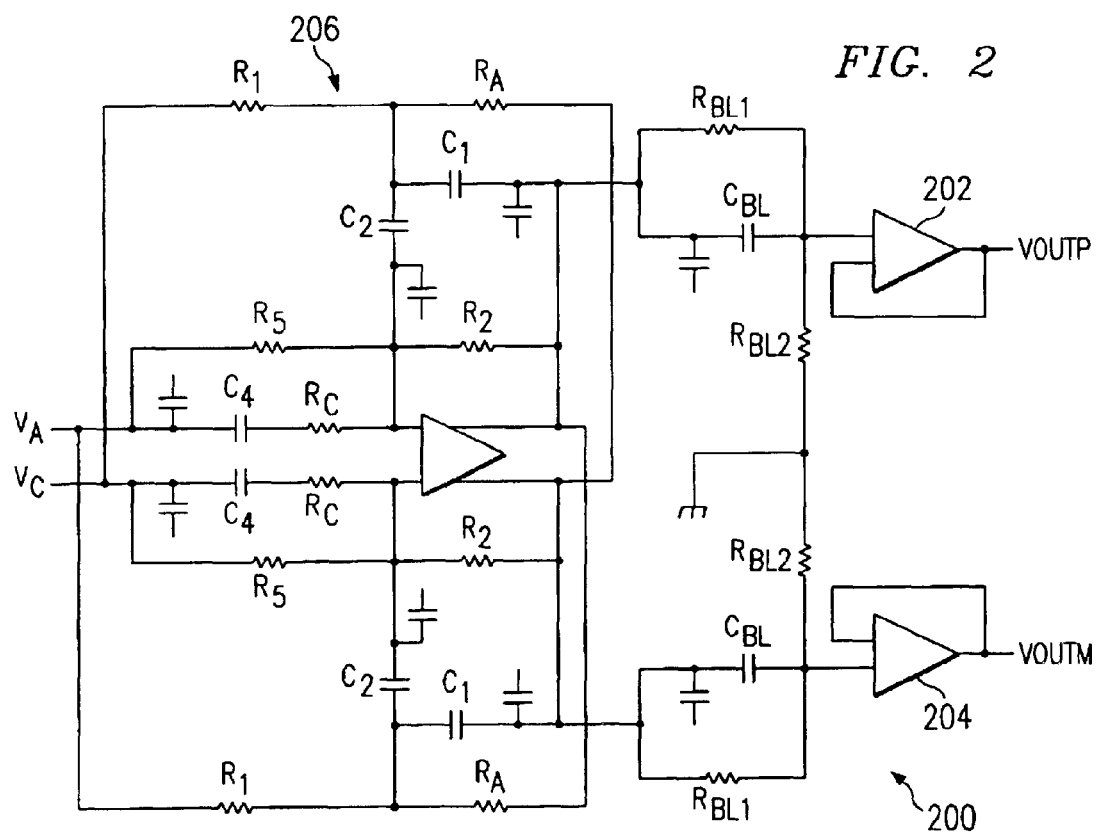
FIG. 2 is a schematic diagram illustrating an active R-C circuit realizing a desired hybrid transfer function according to one embodiment of the present invention.

FIG. 2 is a schematic diagram illustrating an active R-C circuit 200 realizing a desired hybrid transfer function according to one embodiment of the present invention. The present inventor discovered that even when a communication medium comprises capacitively coupled non-ideal transformers and transmission lines, the hybrid transfer function can be very closely approximated by three zeros, z1, z2 and z3, and four poles p1, p2, p3 and p4; and this transfer function can be realized with only two fully-differential amplifiers and a handful of resistors and capacitors. The desired transfer function is expressed by the equation $$h = \frac{k(s-z1)(s-z2)(s-z3)}{(s-p1)(s-p2)(s-p3)(s-p4)}, \tag{3}$$

where $s=j(2\pi f)$.

The foregoing discovery was made by finding a closed form solution for the hybrid transfer function by solving Kirchhoff's equations modeling the line coupling network when lumped model equations are substituted for transmission line equation. The inventor then re-inserted the transmission line expressions, and used a least-squares fit, treating the poles and zeros as fitting parameters to discover remarkably good hybrid rejection. The exact hybrid was found to require three zeros and four poles as shown in equation (3).

The active R-C circuit 200 shown in FIG. 2 was found by the present inventor suitable for realizing the desired hybrid transfer function set forth as equation (3) above. Specifically, the transfer function of Circuit 200 has the form $$\left(\frac{R_2}{R_5}\right) * (1 + s * R_C * C_4) * \tag{4}$$

$$\frac{F(R_1, R_A, R_5, C_4, C_2, C_{BQ})}{G(R_1, R_A, R_2, C_4, C_2, C_{BQ})} * H(R_{BL1}, R_{BL2}, C_{BL}),$$

where F and G are quadratic functions of frequency, and $C_{BQ}$ is $C_1$ in FIG. 2. The components in F determine the complex zero pair. The components in G determine the complex pole pair. The components in H determine one real pole and one complex pole. The last pole is determined by $R_C$ and $C_4$, as shown in equation (4) above. The dc gain is determined by the $R_2/R_5$ ratio; and the high frequency gain is determined generally by the ratio of $C_4$ to the capacitance of the series combination of $C_2$ and $C_1$. The high frequency gain of H is unity (0 dB) due to the circuit 200 topology in order to accommodate minimizing power requirements associated with the buffer amplifiers 202, 204, but can easily be changed with the addition of a single capacitor.

Circuit 200 employs two single-ended buffers 202, 204 in voltage follower configuration to buffer the hybrid circuit 200, instead of a conventional single fully differential amplifier. Circuit 200 can be seen to also employ a fully-differential active biquad section 206.

In summary explanation, an active R-C circuit 200 realizing a desired hybrid transfer function set forth by equation (3) was discovered suitable for use with a modem associated with a communication medium comprising transformers, while not compromising its hybrid rejection even when avoiding the use of inductors. The hybrid transfer function has three zeros and four poles that are realized using only two fully-differential amplifiers in combination with a small plurality of resistors and capacitors, making the hybrid circuit 200 suitable for use with a communication medium comprising capacitively coupled non-ideal transformers and transmission lines while providing remarkably good hybrid rejection without the use of inductors.

In view of the above, it can be seen the present invention presents a significant advancement in the art of active hybrid circuits suitable for use with modems associated with a communication medium comprising transformers. Active R-C circuit 200, for example, simultaneously minimizes the hybrid parts count while solving performance issues without the use of inductors normally used by known solutions. Further, this invention has been described in considerable detail in order to provide those skilled in the active R-C circuit art with the information needed to apply the novel principles and to construct and use such specialized components as are required.

Further, in view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. The transfer function described herein before, for example, can be made programmable simply by using a data processing device such as a digital signal processor, a central processing. unit, a computer, a micro-computer, and a micro-controller, among others, to program the transfer function characteristics such a pole and zero locations.

What is claimed is:
1. An active R-C circuit comprising:
   a fully-differential amplifier;
   a pair of single-ended buffers; and
   a resistor-capacitor network connecting the output of the fully-differential amplifier to the inputs of the pair of single-ended buffers configuring the fully-differential amplifier, pair of single-ended buffers and resistor-capacitor network as a hybrid devoid of inductors and realizing a transfer function providing substantial elimination of a receiver path signal associated with a communication medium comprising capacitively coupled non-ideal transformers and transmission lines;
   wherein the transfer function is represented by the relationship

$$h = \frac{k(s-z1)(s-z2)(s-z3)}{(s-p1)(s-p2)(s-p3)(s-p4)},$$

wherein $s=j(2\pi f)$, p=poles and z=zeroes.

2. The active R-C circuit according to claim 1 wherein the transfer function is operational to provide substantially the same level of hybrid rejection as that provided by a hybrid circuit that employs inductors to achieve a desired hybrid rejection associated with the communication medium comprising capacitively coupled non-ideal transformers and transmission lines.

3. An active R-C circuit comprising:
   a pair of fully-differential amplifiers; and
   a resistor-capacitor network connecting the inputs of the pair of fully-differential amplifiers to realize a transfer function associated with substantial elimination of a receiver path signal associated with a communication medium comprising capacitively coupled non-ideal transformers and transmission lines, the pair of fully-differential amplifiers and the resistor-capacitor network configured as a hybrid devoid of inductors;
   wherein the transfer function is represented by the relationship $$h = \frac{k(s-z1)(s-z2)(s-z3)}{(s-p1)(s-p2)(s-p3)(s-p4)},$$

wherein $s=j(2\pi f)$, p=poles and z=zeroes.

4. The active R-C circuit according to claim 3 wherein the transfer function is operational to provide substantially the same level of hybrid rejection as that provided by a hybrid circuit that employs inductors to achieve a desired hybrid rejection associated with the communication medium comprising capacitively coupled non-ideal transformers and transmission lines.

5. A method of providing a desired hybrid rejection, the method comprising the steps of:
   providing an active inductor-free R-C circuit comprising a fully-differential amplifier, a pair of single-ended buffers; and a resistor-capacitor network connecting the fully-differential amplifier and the pair of single-ended buffers such that the fully-differential amplifier, pair of single-ended buffers and the resistor-capacitor network realize a hybrid transfer function consisting of three zeros and four poles;
   connecting the active R-C circuit into a communication system that employs a communication medium comprising transformers; and
   processing a transmitted signal passing through the active R-C circuit such that the processed signal is combined with a second signal associated with the communication system to substantially prevent the transmitted signal from passing through a receiver path to provide substantially an equal level of hybrid rejection as that provided by a hybrid circuit that employs inductors to achieve a desired hybrid rejection associated with a communication medium comprising capacitively coupled non-ideal transformers and transmission lines.

6. A method of providing a desired hybrid rejection, the method comprising the steps of:
   providing an inductor-free active R-C circuit comprising a pair of fully-differential amplifiers and a resistor-capacitor network connecting the pair of fully-differential amplifiers to realize a hybrid transfer function consisting of three zeros and four poles;
   connecting the active R-C circuit into a communication system that employs a communication medium comprising transformers; and
   substantially processing a transmitted signal passing through the active R-C circuit such that the processed signal is combined with a second signal associated with the communication system to substantially prevent the transmitted signal from passing through a receiver path to provide substantially an equal level of hybrid rejection as that provided by a hybrid circuit that employs inductors to achieve a desired hybrid rejection associated with a communication medium comprising capacitively coupled non-ideal transformers and transmission lines.

7. The method of claim 5 wherein the transfer function is represented by the relationship $$h = \frac{k(s-z1)(s-z2)(s-z3)}{(s-p1)(s-p2)(s-p3)(s-p4)},$$

wherein $s=j(2\pi f)$, p=poles and z=zeroes.

8. The method of claim 6 wherein the transfer function is represented by the relationship $$h = \frac{k(s-z1)(s-z2)(s-z3)}{(s-p1)(s-p2)(s-p3)(s-p4)},$$

wherein $s=j(2\pi f)$, p=poles and z=zeroes.

9. The active R-C circuit according to claim 1 wherein the transfer function has three zeroes and four poles.

10. The active R-C circuit according to claim 3 wherein the transfer function has three zeroes and four poles.

* * * * *